(12) United States Patent
Sun et al.

(10) Patent No.: US 10,809,580 B2
(45) Date of Patent: Oct. 20, 2020

(54) ARRAY SUBSTRATE AND METHOD FOR MANUFACTURING THE SAME, AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Zengbiao Sun, Beijing (CN); Ki Yong Kim, Beijing (CN); Tao Wang, Beijing (CN); Liping Luo, Beijing (CN); Huishuang Liu, Beijing (CN); Huali Yao, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/324,405

(22) PCT Filed: Mar. 25, 2016

(86) PCT No.: PCT/CN2016/077320
§ 371 (c)(1),
(2) Date: Jan. 6, 2017

(87) PCT Pub. No.: WO2017/036123
PCT Pub. Date: Mar. 9, 2017

(65) Prior Publication Data
US 2017/0199413 A1    Jul. 13, 2017

(30) Foreign Application Priority Data
Sep. 6, 2015   (CN) .......................... 2015 1 0561375

(51) Int. Cl.
*G02F 1/1345* (2006.01)
*H01L 27/12* (2006.01)
(Continued)

(52) U.S. Cl.
CPC ........ *G02F 1/13454* (2013.01); *G02F 1/1345* (2013.01); *G02F 1/1368* (2013.01);
(Continued)

(58) Field of Classification Search
CPC ........... G02F 1/134327; G02F 1/13439; G02F 1/13454
See application file for complete search history.

(56) References Cited

U.S. PATENT DOCUMENTS

2008/0024416 A1* 1/2008 Onogi ............... G02F 1/134363
345/92
2008/0117234 A1* 5/2008 Yajima ................. G09G 3/2096
345/690
(Continued)

FOREIGN PATENT DOCUMENTS

CN    102466936 A    5/2012
CN    104090436 A    10/2014
(Continued)

OTHER PUBLICATIONS

International Search Report dated Jun. 27, 2016 issued in corresponding to International Application No. PCT/CN2016/077320.
(Continued)

*Primary Examiner* — Chun-Nan Lin
(74) *Attorney, Agent, or Firm* — Nath, Goldberg & Meyer; Joshua B. Goldberg

(57) ABSTRACT

The present application provides an array substrate and a method for manufacturing the same, and a display device including the array substrate, the array substrate includes a substrate, and a gate drive circuit and a common electrode
(Continued)

line arranged above the substrate, the gate drive circuit and the common electrode line are arranged adjacent to each other, and at least one groove is provided in the common electrode line. In the application, by forming the groove in the common electrode line, flow of the developing solution from the common electrode line to the gate drive circuit can be effectively suppressed, so as to solve the problem that the channel is broken in the thin film transistor of the gate drive circuit due to nonuniform distribution of the developing solution.

12 Claims, 2 Drawing Sheets

(51) Int. Cl.
  *G02F 1/1343* (2006.01)
  *G02F 1/1368* (2006.01)
  *G09G 3/36* (2006.01)

(52) U.S. Cl.
  CPC .... *G02F 1/13439* (2013.01); *G02F 1/134327* (2013.01); *G09G 3/3677* (2013.01); *H01L 27/12* (2013.01); *H01L 27/124* (2013.01); *G02F 2201/121* (2013.01); *G09G 2300/0408* (2013.01); *G09G 2300/0426* (2013.01); *G09G 2310/0286* (2013.01)

(56) References Cited

U.S. PATENT DOCUMENTS

| | | | | |
|---|---|---|---|---|
| 2011/0273648 | A1* | 11/2011 | Lee | G02F 1/134363 349/106 |
| 2011/0299024 | A1* | 12/2011 | Lee, II | G02F 1/133371 349/144 |
| 2011/0304060 | A1* | 12/2011 | Qin | H01L 23/522 257/786 |
| 2012/0113377 | A1 | 5/2012 | Hui | |
| 2013/0039455 | A1* | 2/2013 | Horiuchi | G11C 19/184 377/54 |
| 2014/0125909 | A1* | 5/2014 | Kim | G02F 1/134309 349/46 |
| 2015/0054799 | A1 | 2/2015 | Chang et al. | |

FOREIGN PATENT DOCUMENTS

| | | |
|---|---|---|
| CN | 104238214 A | 12/2014 |
| CN | 104483768 A | 4/2015 |
| CN | 104538412 A | 4/2015 |
| CN | 105261621 A | 1/2016 |

OTHER PUBLICATIONS

First Office Action dated Aug. 28, 2017 corresponding to Chinese application No. 201510561375.X.
Extended European Search Report dated Mar. 7, 2019, for corresponding EP application No. 16818968.6.

* cited by examiner

ARRAY SUBSTRATE AND METHOD FOR MANUFACTURING THE SAME, AND DISPLAY DEVICE

This is a National Phase Application filed under 35 U.S.C. 371 as a national stage of PCT/CN2016/077320, filed Mar. 25, 2016, an application claiming the benefit of Chinese Application No. 201510561375.X, filed Sep. 6, 2015, the content of each of which is hereby incorporated by reference in its entirety.

FIELD OF THE APPLICATION

The present application relates to the field of display technology, and in particular, relates to an array substrate and a method for manufacturing the same, and a display device including the array substrate.

BACKGROUND OF THE APPLICATION

In a thin film transistor liquid crystal display panel (TFT-LCD), a gate drive circuit is generally integrated into an array substrate to form a GOA (Gate On Array) unit for achieving line scanning drive for a display panel.

As shown in FIG. 1, a gate drive circuit 11 is provided in the periphery of the display panel, the gate drive circuit 11 includes a large number of thin film transistors and lines, and density of the lines are relatively large. A common electrode line 12 (Vcom line) is provided near the gate drive circuit 11, and the existing common electrode line 12 is generally designed to be a wide bulk metal, which may lead to a large difference between the density of lines in the gate drive circuit 11 and the line density of the common electrode line 12.

When a patterning process is performed, the above difference will result in nonuniform local developing solution, the developing solution is not consumed in the region corresponding to the bulk metal, and the unconsumed developing solution will spread into the periphery of large line density, as the arrow in FIG. 1 shown, which will result in a broken circuit in the thin film transistor of the gate drive circuit 11, and cause various display adverse phenomena to occur.

SUMMARY OF THE APPLICATION

An object of the present application is to provide an array substrate and a method for manufacturing the same, and a display device including the array substrate, to solve the problem in the prior art that a broken circuit occurs in the thin film transistor of the gate drive circuit due to the nonuniform distribution of the developing solution when the array substrate is manufactured.

To solve the above problem, as an aspect of the application, an array substrate is provided, and the array substrate includes a substrate, a gate drive circuit and a common electrode line arranged above the substrate, the gate drive circuit and the common electrode line are arranged adjacent to each other, and at least one groove is provided in the common electrode line.

Optionally, the groove passes through the common electrode line in a direction perpendicular to the array substrate.

Optionally, a plurality of grooves are provided in the common electrode line, and the plurality of grooves extend in a same direction.

Optionally, the plurality of grooves pass through the common electrode line in a direction perpendicular to the array substrate, the common electrode line is segmented into a plurality of common electrode line strips by the plurality of grooves, the common electrode line further includes a connection part, and the plurality of common electrode line strips are electrically connected by the connection part at one end of the common electrode line.

Optionally, the gate drive circuit includes multiple stages of shift register units which are cascaded, each stage of shift register unit includes a plurality of thin film transistors, and a source and a drain of the thin film transistor and the common electrode line are provided in a same metal layer.

As a second aspect of the application, a method for manufacturing an array substrate is provided, and the array substrate includes a gate drive circuit and a common electrode line which are arranged adjacent to each other and are arranged above a substrate, wherein the method includes steps of:

forming a metal layer above the substrate;
forming a photoresist layer on the metal layer;
performing exposure and development on the photoresist layer; and
performing an etching process on the metal layer to form a pattern of the common electrode line such that at least one groove is formed in the common electrode line.

Optionally, a pattern of a source and a drain of a thin film transistor in the gate drive circuit is also formed while performing the etching process on the metal layer to form the pattern of the common electrode line.

Optionally, the groove passes through the common electrode line in a direction perpendicular to the array substrate.

Optionally, a plurality of grooves are provided in the common electrode line, and the plurality of grooves extend in a same direction.

Optionally, the plurality of grooves pass through the common electrode line in a direction perpendicular to the array substrate, the common electrode line is segmented into a plurality of common electrode line strips by the plurality of grooves, the common electrode line further includes a connection part, and the plurality of common electrode line strips are electrically connected by the connection part at one end of the common electrode line.

As a third aspect of the application, a display device is provided, and the display device includes the above array substrate provided by the application.

In the application, by forming the groove in the common electrode line, flow of the developing solution from the common electrode line to the gate drive circuit can be effectively suppressed, so as to solve the problem that the channel is broken in the thin film transistor of the gate drive circuit due to nonuniform distribution of the developing solution.

BRIEF DESCRIPTION OF THE DRAWINGS

The accompanying drawings are provided for further understanding of the present invention and constitute a part of the description. The accompanying drawings, together with the following embodiments, are provided for explaining the present invention rather than limiting the present invention. In the drawings.

DESCRIPTION OF REFERENCE NUMERALS

10—substrate; 11—gate drive circuit; 12, 22—common electrode line; 22a—common electrode line strip; 22b—connection part; 23—groove.

DETAILED DESCRIPTION OF THE EMBODIMENTS

Embodiments of the present application will be described in detail below with reference to the accompanying drawings. It should be noted that, the embodiments described herein are for the purpose of describing and explaining the present invention, rather than limiting the scope of the present invention.

Figure 1:
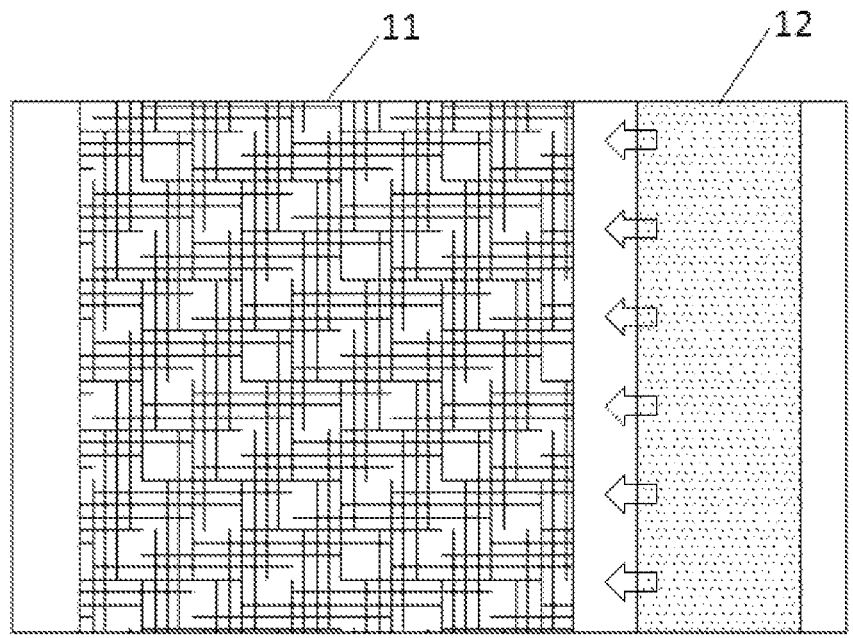
FIG. 1 is a schematic view of an array substrate in the prior art.
Figure 2:
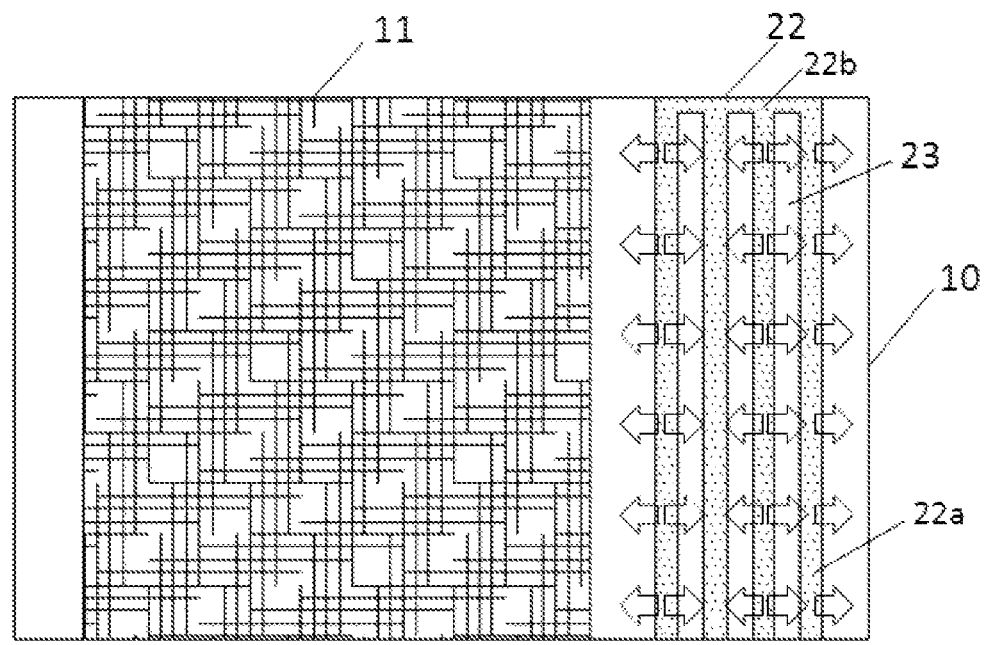
FIG. 2 is a schematic view of an array substrate according to an embodiment of the application.

The application first provides an array substrate, as shown in FIG. 2, and the array substrate includes a substrate 10, and a gate drive circuit 11 and a common electrode line 22 arranged above the substrate 10, wherein the gate drive circuit 11 and the common electrode line 22 are arranged adjacent to each other, and at least one groove 23 is provided in the common electrode line 22.

As described above, the gate drive circuit 11 includes a large number of thin film transistors and connection lines, and these lines have a relatively large density. The existing common electrode line is generally designed to be a wide bulk metal, which will lead to a nonuniform distribution of the developing solution. The developing solution will readily spread to the gate drive circuit 11, which will result in a broken circuit in the thin film transistor of the gate drive circuit 11.

Compared to the prior art, in the application, a groove 23 is provided in the common electrode line which is a bulk of a large area. During a pattering process, the groove 23 not only can consume a part of developing solution, but also can guide flow of the developing solution, so as to improve the distribution uniformity of the developing solution and avoid the phenomenon that local accumulation of the developing solution results in an abnormal broken line from occurring.

In particular, the application can suppress the developing solution to flow from the common electrode line 22 to the gate drive circuit 11, so as to solve the problem that the channel is broken in the thin film transistor of the gate drive circuit 11 due to nonuniform distribution of the developing solution.

Optionally, the groove 23 passes through the common electrode line 22 in a thickness direction (i.e. a direction perpendicular to the array substrate). That is, the groove 23 is formed to be a slit passing through the common electrode line 22 to further increase ability of the groove to guide flow of the developing solution. Moreover, the common electrode line is completely etched so as to make the groove 23 be a slit, which is also easily controlled in the process.

Arrangement of the groove 23 is not limited in the application, and during a practical production, the groove is arranged such that the developing solution is distributed more uniformly.

As a preferable embodiment of the application, as shown in FIG. 2, a plurality of grooves 23 are provided in the common electrode line 22, and the plurality of grooves 23 extend in a same direction. The plurality of grooves 23 are provided to reduce difference between the line density of the common electrode line 22 and that of the gate drive circuit 11 and increase distribution uniformity of the lines on the overall substrate, and thus the distribution of the developing solution is more uniform, and the production yield is increased.

Further, the plurality of grooves 23 pass through the common electrode line 22 in a thickness direction, the common electrode line 22 is segmented into a plurality of common electrode line strips 22a by the plurality of grooves 23, the common electrode line 22 further includes a connection part 22b, and the plurality of common electrode line strips 22a are electrically connected by the connection part 22b at one end of the common electrode line 22. That is, the common electrode line 22 in the application may be designed to be a structure like a comb.

Generally, the gate drive circuit 11 shown in FIG. 2 includes multiple stages of shift register units which are cascaded, and each stage of shift register unit includes a plurality of thin film transistors. In the application, a source and a drain of the thin film transistor and the common electrode line 22 are provided in a same metal layer. During forming a pattern of the metal layer, since the plurality of grooves 23 are provided in the common electrode line 22, the developing solution is prevented from flowing to a region of the gate drive circuit 11 in which the thin film transistors are densely distributed, and thus the problem that the channel between the source and the drain is broken in the thin film transistor of the gate drive circuit 11 due to high concentration of the local developing solution.

Figure 3:
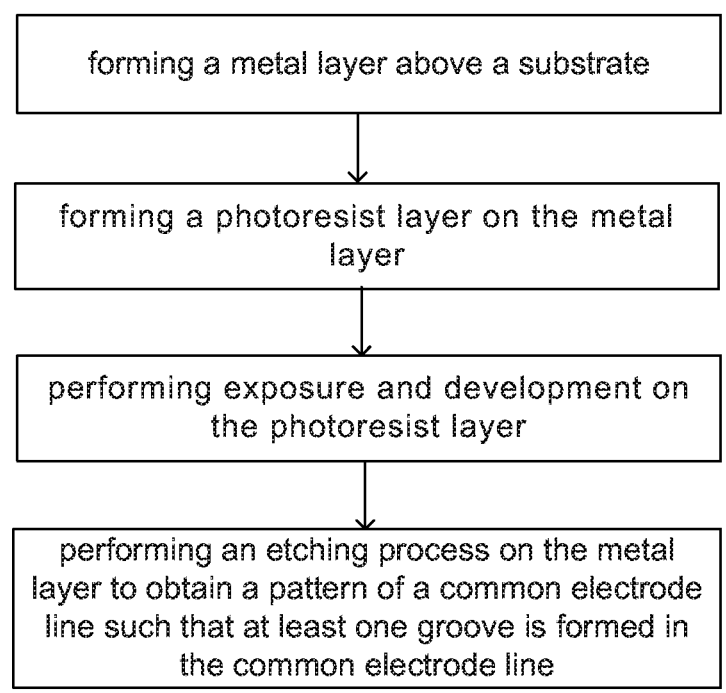
FIG. 3 is a flow chart illustrating a method for manufacturing the thin film transistor according to an embodiment of the application.

As shown in FIG. 3, the application further provides a method for manufacturing an array substrate, which includes a gate drive circuit and a common electrode line which are arranged adjacent to each other and are arranged above a substrate, wherein the method includes steps of:

forming a metal layer above the substrate;

forming a photoresist layer on the metal layer;

performing exposure and development on the photoresist layer; and performing an etching process on the metal layer to form a pattern of the common electrode line such that at least one groove is formed in the common electrode line.

Optionally, a pattern of a source and a drain of a thin film transistor in the gate drive circuit is also formed while performing the etching process on the metal layer to form the pattern of the common electrode line.

It should be understood that, when performing exposure and development on the photoresist layer, a mask pattern of the used mask plate corresponds to a metal pattern to be formed.

In the method for manufacturing an array substrate in the application, a pattern of the common electrode line is improved, and the groove provided in the common electrode line can guide flow of the developing solution in the development process, so as to make the developing solution distribute uniformity on the surface of the metal layer and avoid the phenomenon that local accumulation of the developing solution due to the difference between line densities results in an abnormal broken line from occurring.

In the embodiment of the application, since the gate drive circuit and the common electrode line are arranged adjacent to each other, flow of the developing solution from the common electrode line to the gate drive circuit can be suppressed, so as to solve the problem that the channel is broken in the thin film transistor of the gate drive circuit due to nonuniform distribution of the developing solution.

Optionally, the groove passes through the common electrode line in a thickness direction, to further increase ability of the groove to guide flow of the developing solution.

Further, a plurality of grooves are provided in the common electrode line, and the plurality of grooves extend in a same direction. The plurality of grooves are provided to reduce difference between the line density of the common electrode line and that of the gate drive circuit and increase distribution uniformity of the lines on the overall substrate, and thus the distribution of the developing solution is more uniform, and the production yield is increased.

Arrangement of the groove is not limited in the application, and during a practical production, the groove is arranged such that the developing solution is distributed more uniformly.

For example, the common electrode line may be formed to be a structure like a comb. As shown in FIG. 2, the plurality of grooves 23 pass through the common electrode line 22 in a thickness direction, the common electrode line 22 is segmented into a plurality of common electrode line strips 22a by the plurality of grooves 23, the common electrode line 22 further includes a connection part 22b, and the plurality of common electrode line strips 22a are electrically connected by the connection part 22b at one end of the common electrode line 22.

The application further provides a display device, which includes the above array substrate provided by the application. As described above, in the display device provided by the application, since the lines are distributed more uniformly, the developing solution is distributed more uniformly during the manufacturing process, the phenomenon that local accumulation of the developing solution results in an abnormal broken line can be effectively avoided from occurring, and thus a production yield is increased.

It should be understood that, the above embodiments are only exemplary embodiments for the purpose of explaining the principle of the present application, but the present application is not limited thereto. For a person having ordinary skill in the art, various improvements and modifications may be made without departing from the spirit and essence of the present application. These improvements and modifications also fall within the protection scope of the present application.

What is claimed is:

1. An array substrate, including a substrate, and a gate drive circuit arranged above the substrate in a periphery of the array substrate to form a GOA (Gate On Array) unit for achieving line scanning drive, and a common electrode line arranged above the substrate in the periphery of the array substrate, wherein the gate drive circuit and the common electrode line are arranged adjacent to each other, and at least one groove is provided inside the common electrode line in the periphery of the array substrate.

2. The array substrate of claim 1, wherein the at least one groove passes through the common electrode line in a direction perpendicular to the array substrate.

3. The array substrate of claim 2, wherein the gate drive circuit includes multiple stages of shift register units which are cascaded, each stage of shift register unit includes a plurality of thin film transistors, and a source and a drain of each of the plurality of thin film transistors and the common electrode line are provided in a same metal layer.

4. A display device, including the array substrate of claim 2.

5. The array substrate of claim 1, wherein a plurality of grooves are provided in the common electrode line, and the plurality of grooves extend in a same direction.

6. The array substrate of claim 5, wherein the plurality of grooves pass through the common electrode line in a direction perpendicular to the array substrate, the common electrode line is segmented into a plurality of common electrode line strips by the plurality of grooves, the common electrode line further includes a connection part, and the plurality of common electrode line strips are electrically connected by the connection part at one end of the common electrode line.

7. The array substrate of claim 6, wherein the gate drive circuit includes multiple stages of shift register units which are cascaded, each stage of shift register unit includes a plurality of thin film transistors, and a source and a drain of each of the plurality of thin film transistors and the common electrode line are provided in a same metal layer.

8. A display device, including the array substrate of claim 6.

9. The array substrate of claim 5, wherein the gate drive circuit includes multiple stages of shift register units which are cascaded, each stage of shift register unit includes a plurality of thin film transistors, and a source and a drain of each of the plurality of thin film transistors and the common electrode line are provided in a same metal layer.

10. A display device, including the array substrate of claim 5.

11. The array substrate of claim 1, wherein the gate drive circuit includes multiple stages of shift register units which are cascaded, each stage of shift register unit includes a plurality of thin film transistors, and a source and a drain of each of the plurality of thin film transistors and the common electrode line are provided in a same metal layer.

12. A display device, including the array substrate of claim 1.

* * * * *